US008723226B2

(12) United States Patent
Bahl (10) Patent No.: US 8,723,226 B2
(45) Date of Patent: May 13, 2014

(54) MANUFACTURABLE ENHANCEMENT-MODE GROUP III-N HEMT WITH A REVERSE POLARIZATION CAP

(75) Inventor: Sandeep Bahl, Palo Alto, CA (US)

(73) Assignee: Texas Instruments Incorporated, Dallas, TX (US)

( * ) Notice: Subject to any disclaimer, the term of this patent is extended or adjusted under 35 U.S.C. 154(b) by 93 days.

(21) Appl. No.: 13/302,997

(22) Filed: Nov. 22, 2011

(65) Prior Publication Data

US 2013/0126889 A1    May 23, 2013

(51) Int. Cl.
*H01L 29/66*    (2006.01)

(52) U.S. Cl.
USPC .................................. 257/194; 257/E29.246

(58) Field of Classification Search
USPC .......... 257/190, 192, 194, E29.188, E29.246, 257/E29.249, E29.253, 197
See application file for complete search history.

(56) References Cited

U.S. PATENT DOCUMENTS

| | | | |
|---|---|---|---|
| 2005/0189559 A1* | 9/2005 | Saito et al. | 257/189 |
| 2008/0296618 A1 | 12/2008 | Suh et al. | |
| 2009/0072272 A1* | 3/2009 | Suh et al. | 257/194 |
| 2009/0146185 A1 | 6/2009 | Suh et al. | |
| 2010/0019279 A1 | 1/2010 | Chen et al. | |
| 2010/0102357 A1 | 4/2010 | Sato | |
| 2010/0264461 A1 | 10/2010 | Rajan et al. | |
| 2010/0270591 A1* | 10/2010 | Ahn | 257/194 |
| 2011/0062438 A1* | 3/2011 | Kaneko | 257/43 |

OTHER PUBLICATIONS

Suh, C.S. et al., "p-GaN/AlGaN/GaN Enhancement-Mode HEMTs", 64th Device Research Conference, 2006, pp. 163-164.
Hilt, O. et al., "Normally-off AlGaN/GaN HFET with p-type GaN Gate and AlGaN Buffer", Proceedings of the 22nd International Symposium on Power Semiconductor Devices & IC's (ISPSD), 2010, 9-3 (pp. 347-350).
Kanamura, Masahito et al., "Enhancement-Mode GaN MIS-HEMTs With n-GaN/i-AlN/n-GaN Triple Cap Layer and High-K Gate Dielectrics", IEEE Electron Device Letters, vol. 31, No. 3, 2010, 189-191.
Kambayashi, Hiroshi et al., "Enhancement-mode GaN Hybrid MOS-HFETs on Si substrates with Over 70 A operation", 21st International Symposium on Power Semiconductor Devices & IC's (ISPSD), 2009, pp. 21-24.
Lu, Bin et al., "High-Performance Integrated Dual-Gate AlGaN/GaN Enhancement-Mode Transistor", IEEE Electron Device Letters, vol. 31, No. 9, 2010, 990-992.
Schmidt, R. et al., "Direct Determination of the Built-in Polarization Field in InGaN/GaN Quantum Wells", 12th International Conference on Semiconducting and Insulating Materials, 2002, pp. 48-51.

(Continued)

*Primary Examiner* — Benjamin Sandvik
*Assistant Examiner* — Leslie Pilar Cruz
(74) *Attorney, Agent, or Firm* — Eugene C. Conser; Wade J. Brady, III; Frederick J. Telecky, Jr.

(57) ABSTRACT

An enhancement-mode group III-N high electron mobility transistor (HEMT) with a reverse polarization cap is formed in a method that utilizes a reverse polarization cap structure, such as an InGaN cap structure, to deplete the two-dimensional electron gas (2DEG) and form a normally off device, and a spacer layer that lies below the reverse polarization cap structure and above the barrier layer of the HEMT which allows the reverse polarization cap layer to be etched without etching into the barrier layer.

6 Claims, 7 Drawing Sheets

(56) References Cited

OTHER PUBLICATIONS

Reed, M. J. et al., "Critical layer thickness determination of GaN/InGaN/GaN double heterostructures", Applied Physics Letters, vol. 77, No. 25, 2000, pp. 4121-4123.

Uemoto, Yasuhiro et al., "Gate Injection Transistor (GIT)—A Normally-Off AlGaN/GaN Power Transistor Using Conductivity Modulation", IEEE Transactions on Electron Devices, vol. 54, No. 12, 2007, pp. 3393-3399.

Hu, X. et al., "Enhancement mode AlGaN/Gan HFET with selectively grown pn junction gate", Electronics Letters, vol. 36, No. 8, 2000, pp. 753-754.

Mizutani, T. et al., "AlGaN/GaN HEMTs With Thin InGaN Cap Layer for Normally Off Operation", IEEE Electron Device Letters, vol. 28, No. 7, 2007, pp. 549-551.

Uemoto, Yasuhiro et al., "A Normally-off AlGaN/GaN Transistor with RonA=2.6mΩcm2 and BVds=640V Using Conductivity Modulation", International Electron Devices Meeting (IEDM), 2006, pp. 1-4.

Mishra, Umesh K. et al., "AlGaN/GaN HEMTs—An Overview of Device Operation and Applications", Proceedings of the IEEE, vol. 90, No. 6, 2002, pp. 1022-1031.

* cited by examiner

MANUFACTURABLE ENHANCEMENT-MODE GROUP III-N HEMT WITH A REVERSE POLARIZATION CAP

BACKGROUND OF THE INVENTION

1. Field of the Invention

The present invention relates to enhancement-mode Group III-N HEMTs and, more particularly, to a manufacturable enhancement-mode Group III-N HEMT with a reverse polarization cap.

2. Description of the Related Art

Group III-N high electron mobility transistors (HEMTs) have shown potential superiority for power electronics due to their wider bandgap and high electron saturation velocity. These material properties translate into high breakdown voltage, low on-resistance, and fast switching. Group III-N HEMTs can also operate at higher temperatures than silicon-based transistors. These properties make group III-N HEMTs well suited for high-efficiency power regulation applications, such as lighting and vehicular control.

Figure 1:
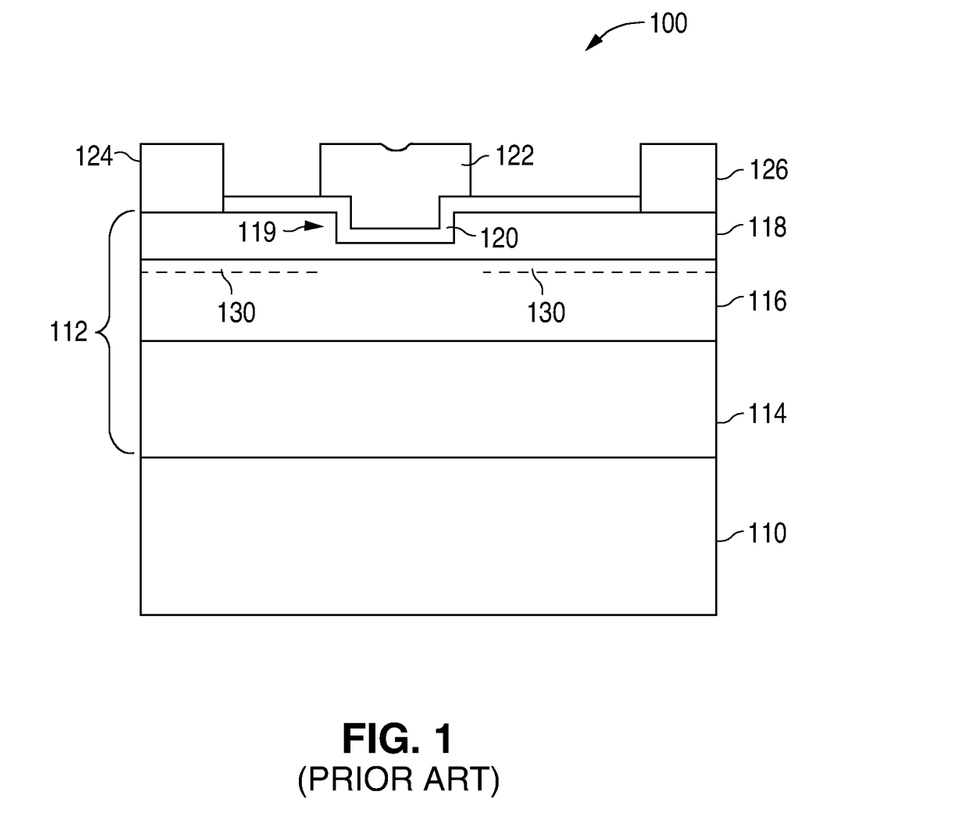
FIG. 1 is a cross-sectional view illustrating a conventional enhancement-mode group III-N HEMT 100.

FIG. 1 shows a cross-sectional view that illustrates a conventional enhancement-mode group III-N HEMT 100. As shown in FIG. 1, enhancement-mode group III-N HEMT 100 includes a substrate 110, and a layered structure 112 that touches the top surface of substrate 110. Substrate 110 is commonly implemented with SiC because SiC has a reasonably low lattice mismatch (~3%) and a high thermal conductivity. SiC substrates, however, are expensive and limited in size. Substrate 110 is also commonly implemented with Si due to the low cost of Si and access to Si processing infrastructure.

Layered structure 112, in turn, includes a buffer layer 114 that touches the top surface of substrate 110, a channel layer 116 that touches the top surface of buffer layer 114, and a barrier layer 118 that touches the top surface of channel layer 116. Barrier layer 118, in turn, has a recess 119 that has a bottom surface that lies vertically above the bottom surface of barrier layer 118.

Buffer layer 114, channel layer 116, and barrier layer 118 are each typically implemented with one or more sequential group-III nitride layers, with the group-III including one or more of In, Ga, and Al. For example, barrier layer 118 is commonly formed from AlGaN, while channel layer 116 is commonly formed from GaN. Thus, channel layer 116 is implemented with a group III-N material that is different from the group III-N material that is used to implement barrier layer 118.

In addition, layered structure 112 is conventionally formed by growing layered structure 112 on substrate 110 using epitaxial deposition techniques such as metal organic chemical vapor deposition (MOCVD) and molecular beam epitaxy (MBE). After layered structure 112 has been formed, recess 119 is formed with a conventional mask and etch step.

Buffer layer 114 provides a transition layer between substrate 110 and channel layer 116 in order to address the difference in lattice constant and to provide a dislocation-minimized growing surface. However, when substrate 110 is formed from silicon, it is difficult to grow buffer layer 114 thicker than 2-3 um on a 6-inch substrate due to the stress, the subsequent bowing of the wafer, and cracking of the nitride films.

As further shown in FIG. 1, enhancement-mode group III-N HEMT 100 also includes a gate dielectric 120 that touches the top surface of layered structure 112 and lines recess 119, and a metal gate 122 that touches the top surface of gate dielectric 120. In addition, enhancement-mode group III-N HEMT 100 includes a metal source 124 and a metal drain 126 that make ohmic contacts through barrier layer 118. Metal source 124 and metal drain 126 are horizontally-spaced apart and electrically connected to channel layer 116.

In operation, as discussed in Mishra et al., "AlGaN/GaN HEMTs—An Overview of Device Operation and Applications", Proceedings of the IEEE, Vol. 90, No. 6, June 2002, pp. 1022-1031, the channel layer and the barrier layer of a HEMT have different polarization properties and band gaps that induce, as shown in FIG. 1, the formation of a two-dimensional electron gas (2DEG) 130 that lies at the top of the channel layer. The 2DEG 130, which has a high concentration of electrons, is similar to the channel in a conventional field effect transistor (FET).

Further, in an enhancement-mode device, the 2DEG 130 is normally depleted of electrons under the gate, and thereby normally an off device. Thus, when ground is placed on metal gate 122, no current flows from metal drain 126 to metal source 124 by way of the 2DEG 130. However, when ground is placed on metal source 124, a positive voltage is placed on metal drain 126, and a positive voltage greater than the threshold voltage is placed on metal gate 122, a current flows from metal drain 126 to metal source 124 by way of the 2DEG 130.

Thus, during the operation of enhancement-mode group III-N HEMT 100, each time group III-N HEMT 100 is turned on and off, a large voltage is placed on and then removed between metal gate 122 and metal drain 126. The application and removal of a large voltage over many thousands of times stresses parts of the HEMT, such as gate dielectric 120, and leads to the eventual failure of enhancement-mode group III-N HEMT 100. As a result, it is desirable to have a dielectric-free enhancement-mode group III-N HEMT.

In "Gate Injection Transistor (GIT)—A Normally-Off AlGaN/GaN Power Transistor Using Conductivity Modulation," IEEE Transactions on Electron Devices (TED), Vol. 54, Issue 12, 2007, pp. 3393-3399, Uemoto et al proposed an enhancement-mode group III-N HEMT that utilized a p-doped (Mg) cap of AlGaN in lieu of gate dielectric 120. The p-type dopant depletes the 2DEG, thereby forming a normally off device. The device is then turned on by, for example, placing ground on metal source 124, a positive voltage on metal drain 126, and a positive voltage that is greater than the threshold voltage on metal gate 122.

In the enhancement-mode group III-N HEMT using the hole injection principle, the turn off time is unfortunately slowed down due to the need to extract the holes. Another issue is that it is difficult to remove the p-doped AlGaN layer, which lies on the AlGaN barrier layer, from regions where it is not needed to form the cap of AlGaN, thereby increasing variability. If a GaN cap is used instead of the cap of AlGaN (which was used in lieu of gate dielectric 120), such as from UC Santa Barbara or Ferdinand-Braun-Institut, the above issues are simplified, but the maximum allowable voltage on the gate terminal is limited by junction turn on, which may not meet the requirement of circuit designers.

In "AlGaN/GaN HEMTs with Thin InGaN Cap Layer for Normally Off Operation," IEEE Electron Device Letters, Vol. 28, Issue 7, 2007, pp. 549-551, Mizutani et al proposed an enhancement-mode group III-N HEMT that utilized a reverse polarization cap of InGaN in lieu of gate dielectric 120. The reverse polarization of InGaN raises up the conduction band and depletes the 2DEG, thereby forming a normally off device. The device is then turned on by, for example, placing ground on metal source 124, a positive voltage on metal drain 126, and a positive voltage that is greater than the threshold voltage on metal gate 122.

One of the weaknesses of the enhancement-mode group III-N HEMT proposed by Mizutani is that the device can not be reliably manufactured on a large scale because it is difficult to form a patterned InGaN structure that sits on an AlGaN barrier layer. Mizutani proposed fabricating the enhancement-mode group III-N HEMT by first growing a thin InGaN cap layer on the top surface of the barrier layer. Then, after a metal gate has been formed (metal deposition, mask, and etch), the metal gate itself is used as a mask to remove the exposed regions of the thin InGaN cap layer.

However, it is difficult to remove the exposed regions of the thin InGaN cap layer without removing portions of the underlying AlGaN barrier layer due to a lack of a selective etch to do so. Thus, there is a need for an enhancement-mode group III-N HEMT that reduces the problems associated with a gate dielectric and that allows for manufacturable fabrication. In addition, there is also a need to increase the maximum allowable gate voltage in order to better meet the needs of circuit designers.

DETAILED DESCRIPTION OF THE INVENTION

Figure 2A:
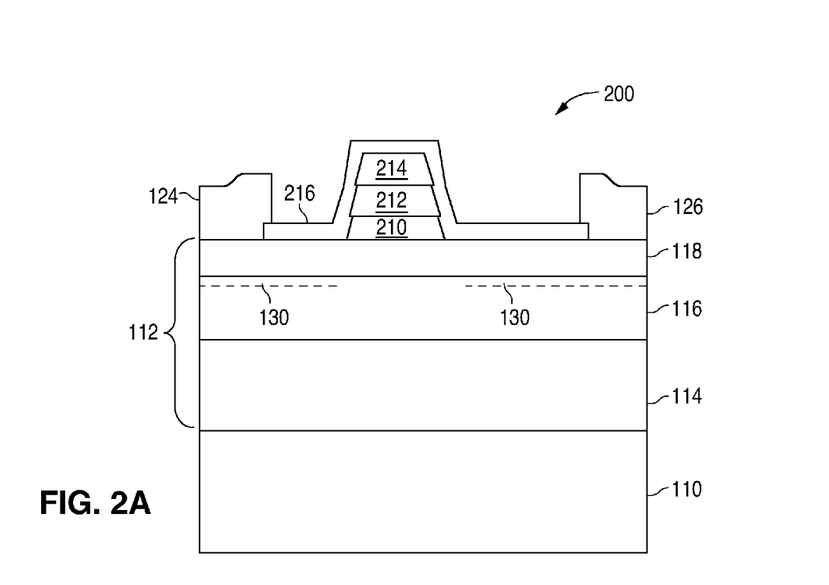
FIG. 2A is a cross-sectional view illustrating an example of a enhancement-mode group III-N HEMT 200 in accordance with the present invention.

FIG. 2A shows a cross-sectional view that illustrates an example of an enhancement-mode group III-N HEMT 200 in accordance with the present invention. As described in greater detail below, the present invention utilizes materials and selective etches to reliably manufacture on a large scale enhancement-mode group III-N HEMTs with a reverse polarization cap.

Enhancement-mode group III-N HEMT 200 has similarity with enhancement-mode group III-N HEMT 100 and, as a result, utilizes the same reference numerals to designate the structures which are common to both enhancement-mode group III-N HEMTs. In the present example, enhancement-mode group III-N HEMT 200 differs from enhancement-mode group III-N HEMT 100 in that enhancement-mode group III-N HEMT 200 omits recess 119.

As shown in FIG. 2A, enhancement-mode group III-N HEMT 200 also differs from enhancement-mode group III-N HEMT 100 in that enhancement-mode group III-N HEMT 200 includes a spacer structure 210 that touches the top surface of barrier layer 118 of layered structure 112. Spacer structure 210 is implemented with a group III-N material which can be selectively etched with respect to the group III-N material that is used to form barrier layer 118.

In the present example, spacer structure 210 is implemented with GaN and barrier layer 118 is implemented with AlGaN. Thus, spacer structure 210 is implemented with a group III-N material that is different from the group III-N material that is used to implement barrier layer 118. Spacer structure 210 can be either doped or undoped. One of the advantages of an undoped GaN spacer structure is that an undoped GaN spacer structure avoids the complexities of a p-type dopant like Mg.

Enhancement-mode group III-N HEMT 200 further differs from enhancement-mode group III-N HEMT 100 in that enhancement-mode group III-N HEMT 200 includes a reverse polarization cap structure 212 that touches the top surface of spacer structure 210, and a metal gate 214 that touches the top surface of reverse polarization cap structure 212.

Reverse polarization cap structure 212 is implemented with a group III-N material which normally depletes the 2DEG 130, and which does not need to be selectively etched with respect to the group III-N material that is used to form spacer structure 210. Spacer structure 210 is implemented with a group III-N material which can be selectively etched with respect to the group III-N material that is used to form barrier layer 118.

In the present example, reverse polarization cap structure 212 is implemented with InGaN, spacer structure 210 is implemented with GaN, and barrier layer 118 is implemented with AlGaN. Thus, reverse polarization cap structure 212 is implemented with a group III-N material that is different from the group III-N material that is used to implement spacer structure 210. Further, spacer structure 210 is implemented with a group III-N material that is different from barrier layer 118 and reverse polarization cap structure 212.

In addition, enhancement-mode group III-N HEMT 200 differs from enhancement-mode group III-N HEMT 100 in that enhancement-mode group III-N HEMT 200 includes a passivation layer 216 that touches barrier layer 118, spacer structure 210, reverse polarization cap structure 212, and metal gate 214.

Passivation layer 216 has an opening that exposes a region of metal gate 214, an opening that exposes a first region of barrier layer 118, and an opening that exposes a second region of barrier layer 118. Metal source 124 extends through the opening in passivation layer 216 to touch the first region of barrier layer 118, while metal drain 126 extends through the opening in passivation layer 216 to touch the second region of barrier layer 118.

Figure 2B:
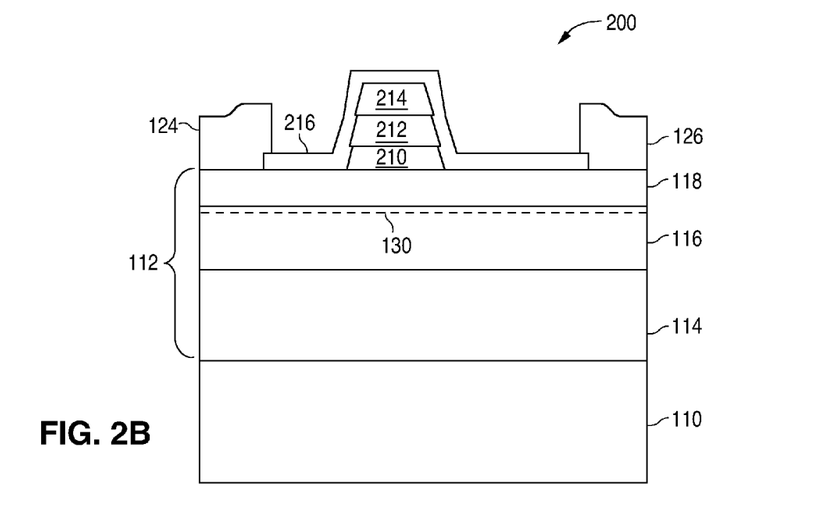
FIG. 2B is a cross-sectional view illustrating an example of enhancement-mode group III-N HEMT 200 when a positive voltage greater than the threshold voltage is placed on metal gate 214 in accordance with the present invention.

In operation, when ground is placed on metal gate 214, metal source 124, and metal drain 126, no two-dimensional electron gas 2DEG 130 is present directly below metal gate 214 and no current flows from metal drain 126 to metal source 124 by way of the 2DEG 130. This case is illustrated in FIG. 2A. FIG. 2B shows a cross-sectional view that illustrates an example of enhancement-mode group III-N HEMT 200 when a positive voltage greater than the threshold voltage is placed on metal gate 214 in accordance with the present invention.

As shown in FIG. 2B, placing a positive voltage greater than the threshold voltage on metal gate 214 generates the 2DEG 130 directly below metal gate 214. As a result, when ground is placed on metal source 124, a positive voltage is placed on metal drain 126, and a positive voltage greater than the threshold voltage is placed on metal gate 214, a current flows from metal drain 126 to metal source 124 by way of the 2DEG 130.

Figure 2C:
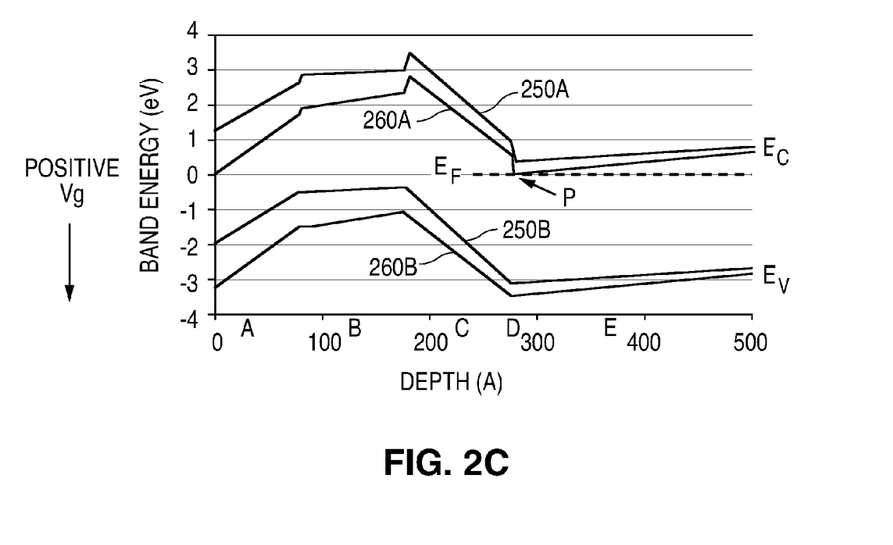
FIG. 2C are band diagrams further illustrating the operation of enhancement-mode group III-N HEMT 200 in accordance with the present invention.

FIG. 2C shows band diagrams that further illustrate the operation of enhancement-mode group III-N HEMT 200 in accordance with the present invention. As shown in FIG. 2C, lines 250A and 250B represent the application of ground to metal gate 214, while lines 260A and 260B represent the application of 1.2V to metal gate 214.

Lines 250A, 250B, 260A, and 260B are based on HEMT 200 having an InGaN cap structure 212 with a thickness of 8 nm and 10% indium, a GaN spacer structure 210 with a thickness of 10 nm, an AlGaN barrier layer 118 with a thickness of 10 nm and 25% aluminum, and a threshold voltage of 0.4V. In addition, region A represents InGaN cap structure 212, region B represents GaN spacer structure 210, region C represents AlGaN barrier layer 118, region D represents the 2DEG 130, and region E represents GaN channel 116.

As further shown in FIG. 2C, the 2DEG 130 is depleted of electrons when ground is applied to metal gate 214. However, the 2DEG 130 becomes populated with electrons and turns on when the gate voltage Vg applied to metal gate 214 exceeds the threshold voltage. As shown at point P, the 2DEG 130 is on and populated with electrons when a gate voltage of 1.2V is applied. In addition, after channel formation, some gate voltage is dropped across GaN spacer structure 210 which, in turn, extends the range of the forward gate voltage.

The threshold voltage of enhancement-mode group III-N HEMT 200 can be varied by varying the thickness of reverse polarization cap structure 212. For example, increasing the thickness of an InGaN cap structure 212 from approximately 80 nm to approximately 120 nm increases the threshold voltage from approximately 0.4V to approximately 1.2V.

In addition, the threshold voltage of enhancement-mode group III-N HEMT 200 can also be varied by varying the mole fraction of reverse polarization cap structure 212. For example, increasing the percentage of indium in an InGaN cap structure 212 from approximately 10% to approximately 15% increases the threshold voltage from approximately 0.4V to approximately 1.2V.

The maximum thickness of an InGaN cap structure 212 to produce a good quality layer is dependent on the percentage of indium that is present in an InGaN cap structure 212. For example, when an InGaN cap structure 212 includes 10% indium, the maximum thickness of a good quality layer is 30 nm. When an InGaN cap structure 212 includes 15% indium, the maximum thickness of a good quality layer is 15 nm. These thicknesses are enough to achieve the desired range of threshold voltages.

Figure 3A:
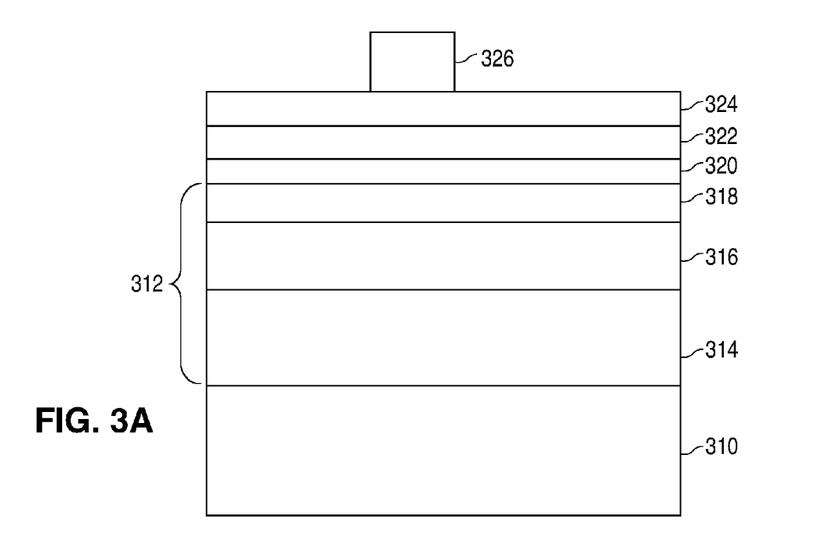
FIGS. 3A-3H are cross-sectional views illustrating an example of a method of forming an enhancement-mode group III-N HEMT in accordance with the present invention.

FIGS. 3A-3H show cross-sectional views that illustrate a method of forming an enhancement-mode group III-N HEMT in accordance with the present invention. As shown in FIG. 3A, the method of the present invention utilizes a conventionally-formed, single-crystal, Si semiconductor substrate 310 (e.g., <111>).

As further shown in FIG. 3A, the method of the present invention begins by forming a layered structure 312 on substrate 310. Layered structure 312, in turn, includes a buffer layer 314, a channel layer 316, and a barrier layer 318. Buffer layer 314, channel layer 316, and barrier layer 318 can each be implemented with one or more sequential group-III nitride layers, with the group-III including one or more of In, Ga, and Al. For example, buffer layer 314 can be implemented with sequential layers of AlN (a thermally-stable material), AlGaN, and GaN. In addition, channel layer 316 can be implemented with, for example, GaN, and barrier layer 318 can be implemented with, for example, AlGaN.

Layered structure 312 can be formed in a conventional manner, such as by placing substrate 110 in a MOCVD reactor and epitaxially growing buffer layer 314 on the top surface of substrate 310, channel layer 316 on the top surface of buffer layer 314, and barrier layer 318 on the top surface of channel layer 316. Thus, layered structure 312 can be formed by growing a buffer layer 314 on substrate 310, growing a group III-N channel layer 316 on buffer layer 314, and growing a group III-N barrier layer 318 on group III-N channel layer 316.

As additionally shown in FIG. 3A, following the conventional formation of layered structure 312, the method continues by forming a group III-N spacer layer 320 to touch the top surface of layered structure 312, followed by the formation of a group III-N cap layer 322 that touches the top surface of group III-N spacer layer 320.

Group III-N spacer layer 320, which is etch selective to the group III-N material of barrier layer 318 of layered structure 312, can be implemented with, for example, GaN. In addition, group III-N cap layer 322, which does not need to be etch selective to group III-N spacer layer 320, can be implemented with, for example, InGaN. Further, group III-N spacer layer 320 and group III-N cap layer 322 can both be epitaxially grown in the MOCVD reactor in a conventional manner following the formation of barrier layer 118.

Next, a layer of gate metal 324, using common metals such as Ti, TiN, Al, and W, is sputter deposited to touch the top surface of group III-N cap layer 322. After gate metal layer 324 has been deposited, a patterned photoresist layer 326 is formed on gate metal layer 324 in a conventional manner, which includes depositing a layer of photoresist, projecting a light through a patterned black/clear glass plate known as a mask to soften the photoresist regions exposed by the light, and removing the softened photoresist regions.

Figure 3B:
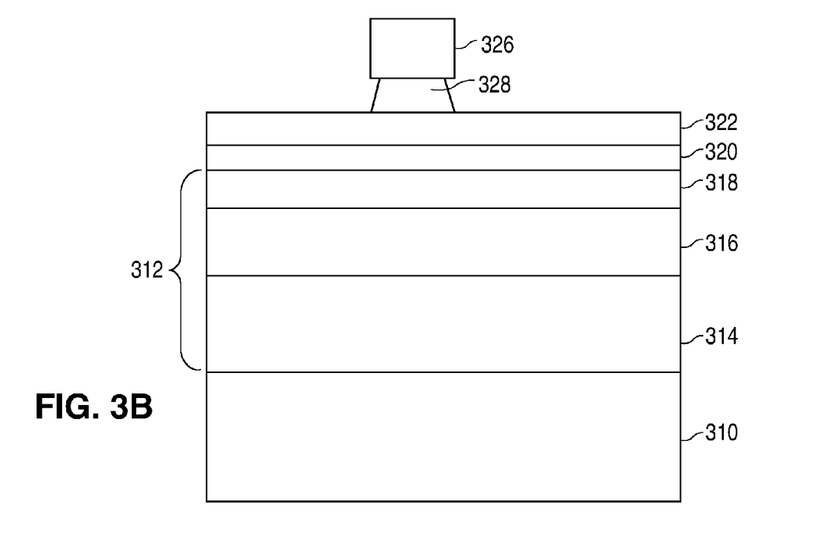

As shown in FIG. 3B, after patterned photoresist layer 326 has been formed, the exposed regions of gate metal layer 324 are etched to expose the top surface of group III-N cap layer 322 and form a metal gate 328 that sits on the top surface of group III-N cap layer 322. Gate metal layer 324 can be etched using a dry etch such as reactive ion etching, or a timed wet etch.

Figure 3C:
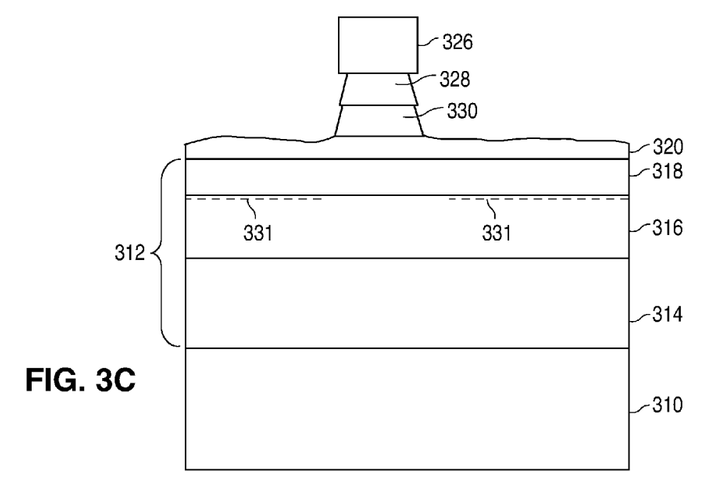

Following this, as shown in FIG. 3C, group III-N cap layer 322 is etched to expose the top surface of group III-N spacer layer 320 and form a reverse polarization cap structure 330 that sits on the top surface of group III-N spacer layer 320. In addition, as further shown in FIG. 3C, the removal also generates a 2DEG 331. In the present example, group III-N cap layer 322 is dry etched with a non-selective timed $BCl_3$-based timed etch, including an overetch to make sure that the group III-N cap layer 322 is etched everywhere on the wafer. Since the etch is non-selective and there will be some non-uniformity in the etch rate, the amount of spacer layer 320 remaining following the etch varies from place to place.

Figure 3D:
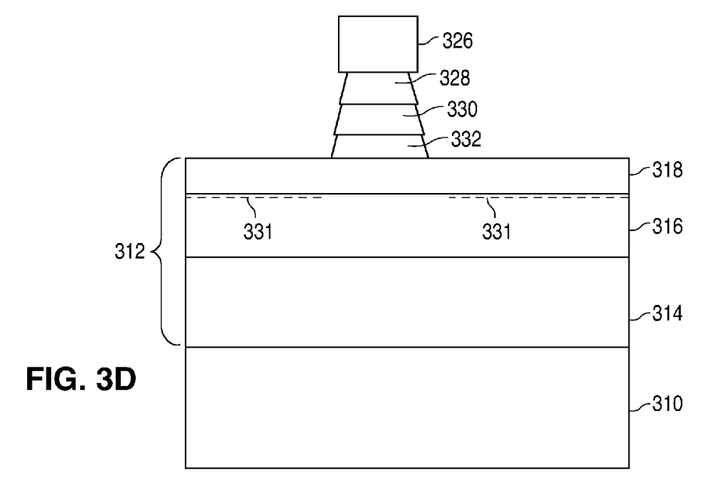

As shown in FIG. 3D, after reverse polarization cap structure 330 has been formed, group III-N spacer layer 320 is etched to expose the top surface of barrier layer 318 of layered structure 312 and form a spacer structure 332 that sits on the top surface of barrier layer 318. In the present example, group III-N spacer layer 320 is dry etched with an $SF_6$-based chemistry that is selective to barrier layer 318, i.e., an etchant that removes substantially more of group III-N spacer layer 320 than barrier layer 318. This corrects for the variation of spacer layer 320, from place to place, due to the prior timed etch, and results in a uniform and smooth surface and thickness for barrier layer 318. Following the formation of spacer structure 332, patterned photoresist layer 326 is removed in a conventional manner, such as with acetone.

Figure 3E:
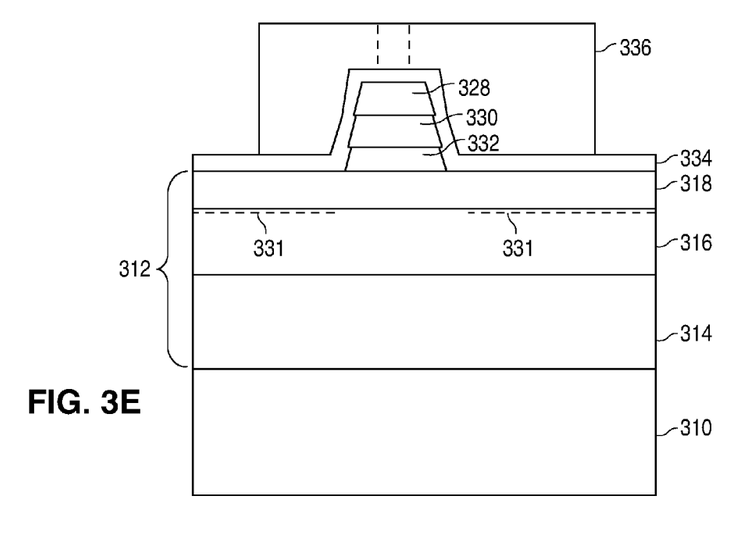

As shown in FIG. 3E, after patterned photoresist layer 326 has been removed, a passivation layer 334 is deposited onto barrier layer 318, metal gate 328, cap structure 330, and spacer structure 332 in a conventional manner. Passivation layer 334 can be implemented with, for example, a layer of $Si_3N_4$, followed by a layer of $SiO_2$. After the formation of passivation layer 334, a patterned photoresist layer 336 is formed on the top surface of passivation layer 334 in a conventional manner. (A pair of vertical dashed lines are shown in patterned photoresist layer 336 to illustrate an opening in patterned photoresist layer 336 that lies outside of the cut plane shown in FIG. 3E.)

Figure 3F:
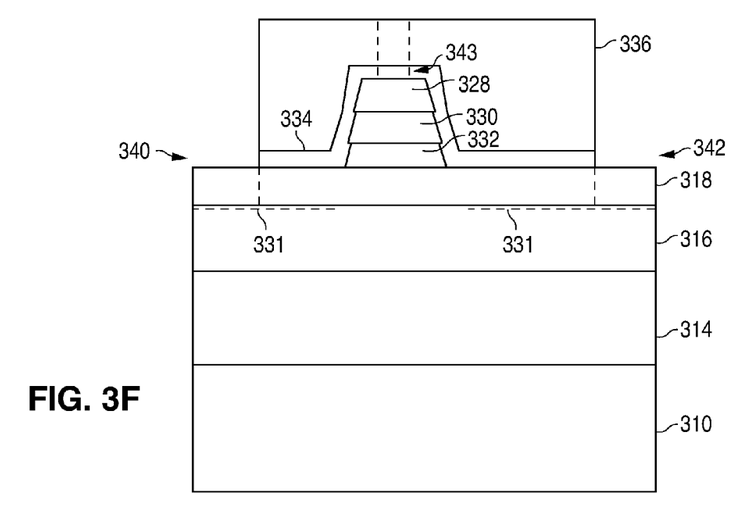

As shown in FIG. 3F, after patterned photoresist layer 336 has been formed, the exposed regions of passivation layer 334 are etched to form a source opening 340 and a drain opening 342 that each expose the top surface of barrier layer 318. Alternately, a portion of or all of the underlying barrier layer 318 can also be etched as illustrated by the vertical dashed lines in barrier layer 318.

In addition, the etch further forms a gate opening 343 in passivation layer 334 (shown with a pair of vertical dashed lines because gate opening 343 lies outside of the cut-plane shown in FIG. 3F) that exposes a region of the top surface of metal gate 328. Following this, patterned photoresist layer 336 is removed in a conventional manner.

Figure 3G:
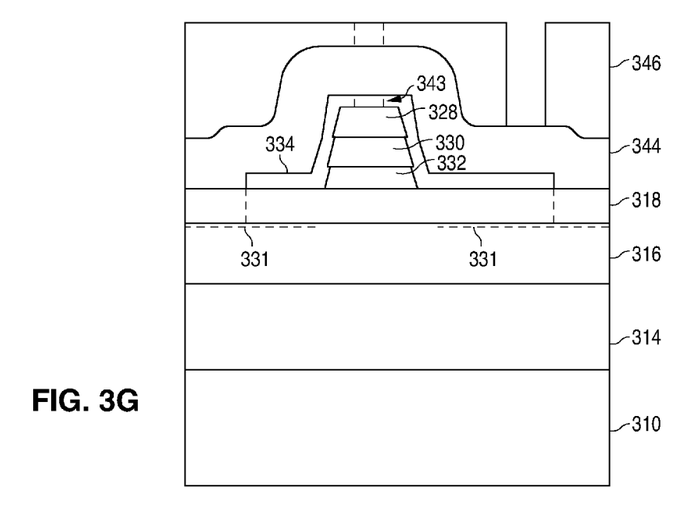

Next, as shown in FIG. 3G, a layer of ohmic metal 344 is deposited to touch barrier layer 318, a portion of metal gate 328, and passivation layer 334 in a conventional manner. In the present example, ohmic metal layer 344 can be implemented with a layer of titanium, followed by a layer of aluminum and an overlying layer of tungsten or aluminum nitride. After the formation of ohmic metal layer 344, a patterned photoresist layer 346 is formed on the top surface of ohmic metal layer 344 in a conventional manner. (A pair of vertical dashed lines are shown in patterned photoresist layer 346 to illustrate a region of ohmic metal layer 344 protected by patterned photoresist layer 336 that lies outside of the cut plane of FIG. 3G.)

Figure 3H:
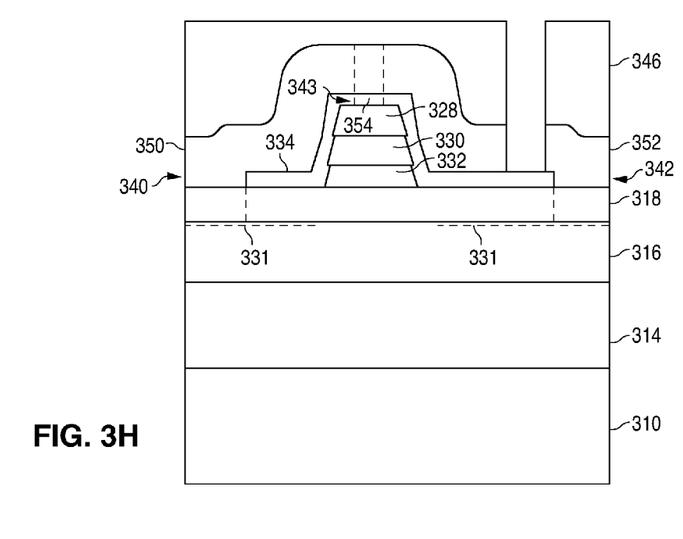

As shown in FIG. 3H, after patterned photoresist layer 346 has been formed, the exposed regions of ohmic metal layer 344 are etched to form a metal source 350 that touches passivation layer 334, lies in source opening 340 to touch barrier layer 318, and extends to lie directly vertically over the top surface of metal gate 328 to form a field plate. The etch also forms a metal drain 352 that lies in drain opening 342 to touch barrier layer 318.

The etch further forms a metal extender 354 (shown in dashed lines because metal extender 354 lies outside of the cut-plane shown in FIG. 3H) that lies in gate opening 343 to touch the top surface of metal gate 328. Following this, patterned photoresist layer 346 is removed in a conventional manner.

Once patterned photoresist layer 346 has been removed, the resulting structure is alloyed at a temperature in the range of 500-900° C. to electrically connect metal source 350 and metal drain 352 to 2DEG 331 in channel layer 316. As further shown in FIG. 3H, the junction between metal source 350 and barrier layer 318, and the junction between metal drain 352 and barrier layer 318 are dashed to illustrate that the metal is alloying through barrier layer 318. After this, the method continues with conventional steps.

Thus, an enhancement-mode group III-N HEMT and a method of forming an enhancement-mode group III-N HEMT with a reverse polarization cap have been described. One of the advantages of the present invention is that the etch selectivity of spacer layer 320 to barrier layer 318 allows enhancement-mode group III-N HEMTs with reverse polarization caps to be reliably manufactured on a large scale. In addition, the threshold voltage can be adjusted by varying the thickness or the indium mole fraction of reverse polarization cap layer 322. Further, spacer layer 320 also allows the range of the forward gate voltage Vg to be extended.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A transistor comprising:
a substrate having a top surface;
a layered structure having a top surface, and including a buffer layer that touches the top surface of the substrate, a channel layer that touches the buffer layer, and a barrier layer that touches the channel layer, the barrier layer including a first group III-N material;
wherein the barrier layer that touches the channel layer forms a two-dimensional electron gas (2DEG) that lies at a top of the channel layer;
a metal source that touches a first region of the barrier layer, the metal source being electrically connected to the channel layer;
a metal drain that touches the a second region of the barrier layer, the metal drain being electrically connected to the channel layer, and horizontally spaced apart from the metal source;
an undoped GaN spacer structure having a top surface, and touching the top surface of the layered structure, the spacer structure is in between and horizontally spaced apart from both the metal source and the metal drain, the undoped GaN is a second group III-N material that is different from the first group III-N material;
a reverse polarized structure having a top surface, touching the top surface and is coextensive with the spacer structure, the reversed polarized structure including a third group III-N material that is different from the second group III-N material;
a metal gate that touches the top surface and is coextensive with the reverse polarized structure; and
a passivation layer that touches and lies over the barrier layer in the space between the spacer structure and the metal source and drain, the spacer structure, the reverse polarized structure, and the metal gate, the passivation layer having an opening that exposes a region of the metal gate, an opening that exposes the metal source, and an opening that exposes the metal drain.

2. The transistor of claim 1 wherein a portion of the metal source touches the passivation layer directly vertically over a portion of the metal gate.

3. The transistor of claim 1 wherein the third group III-N material includes InGaN.

4. The transistor of claim 3 wherein the first group III-N material includes AlGaN.

5. The transistor of claim 4 further comprising the two-dimensional electron gas (2DEG) that lies at a top of the channel layer, the reverse polarized structure depleting the 2DEG of electrons when ground is placed on the metal gate.

6. The transistor of claim 3 wherein the spacer structure includes two elements in common with the barrier layer and the reverse polarized structure, and the reverse polarized structure includes an element not present in the barrier layer.

* * * * *